United States Patent [19]

Sottile et al.

[11] 3,851,328

[45] Nov. 26, 1974

[54] OPTICAL SOLID STATE SWITCHES

[75] Inventors: Michael R. Sottile, Pine Brook; Anthony F. Sanducci, Oakland, both of N.J.

[73] Assignee: The Singer Company, Little Falls, N.J.

[22] Filed: Jan. 17, 1973

[21] Appl. No.: 324,366

[52] U.S. Cl. .............. 340/337, 178/17 D, 250/221, 250/237 R, 307/311, 340/325, 340/336, 340/365 P

[51] Int. Cl. .............. G08b 5/36

[58] Field of Search ........ 340/325, 336, 337, 365 P; 178/17 D; 307/311; 250/221, 222 R, 237 R

[56] References Cited

UNITED STATES PATENTS

| | | | |
|---|---|---|---|
| 2,001,124 | 5/1935 | Cooke | 340/325 |
| 3,056,030 | 9/1962 | Kelchner | 340/365 P X |
| 3,157,843 | 11/1964 | Koncen | 307/311 X |
| 3,235,741 | 2/1966 | Plaisance | 340/365 P X |
| 3,372,789 | 3/1968 | Thiele et al. | 340/365 P X |
| 3,521,072 | 7/1970 | Wipson et al. | 250/221 X |
| 3,526,775 | 9/1970 | Friedrich et al. | 340/365 P X |
| 3,579,047 | 5/1971 | Sturm et al. | 250/222 R X |
| 3,610,939 | 10/1971 | Fitzgerald | 250/237 X |

*Primary Examiner*—David L. Trafton
*Attorney, Agent, or Firm*—T. W. Kennedy

[57] ABSTRACT

A basic switching apparatus for use in a control panel comprising an opening in the panel with a light emitting diode embedded in one side and a photodetector in the other side so that an operator may place his finger in the opening to obtain a switching action is shown. Also shown are logic circuits and display devices which may be added to the switch to permit using it as an alternate action switch, potentiometer, rotary switch and thumbwheel switch along with multiplexing apparatus useful where a large number of these devices are installed on a control panel.

14 Claims, 12 Drawing Figures

OPTICAL SOLID STATE SWITCHES

BACKGROUND OF THE INVENTION

This invention relates to electronic control and display panels in general and more particularly to an improved type of switch and display for use in such panels.

Associated with the operation of various types of electronic equipment are control panels used to operate that equipment in a selective manner. For example, such panels are used in aircraft, spacecraft, shipboard and in various other types of applications. In general, the panel will comprise a plurality of switches such as rotary switches, thumbwheel switches, toggle switches, push-button switches, etc. In addition, potentiometers and readout devices to provide a display of the values of various quantities may also be installed. It has been established that the types of switches presently used do not attain the degree of reliability which is desired, particularly in military applications. These devices fail because of the effects of age, humidity and temperature, vibration, shock and other environmental conditions to which they are subjected. Also, in the case of switches, various electrical problems occur such as contact bounce and contact resistance in low current circuitry. Thus, elimination of most, if not all, of the mechanical components in these devices could lead to a much more reliable panel for use in controlling such electronic equipment.

SUMMARY OF THE INVENTION the present invention discloses a switch which makes use of a light beam as a coupling medium. Light from a light emitting diode or incandescent bulb is detected by a photo-detector. Switching action is obtained by breaking the light beam between the two devices to activate logic circuitry. Various types of logic circuitry including counters, shift registers, etc. are used to provide the equivalent of the various types of switches. Since the nature of this switch is such as not to provide a mechanical indication of its position in all cases, solid state feedback displays are used to provide the operator with an indication of the switch operation.

DETAILED DESCRIPTION OF THE PREFERRED EMBODIMENT

Figure 1:
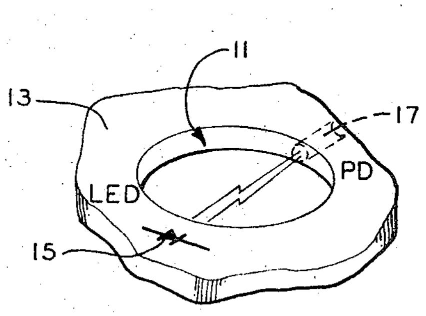
FIG. 1 is a perspective view for a preferred type of finger actuated switch for use in the present invention.
Figure 2:
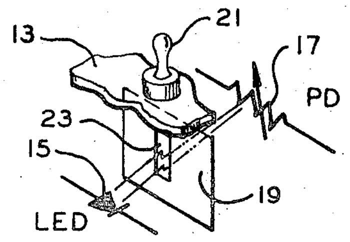
FIG. 2 is a perspective view of a toggle type switch for use in the present invention.
Figure 3:
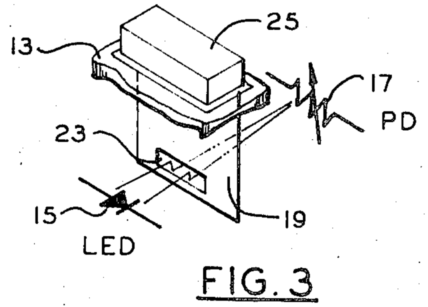
FIG. 3 is a similar view of a push button switch for use in the present invention.
Figure 4A:
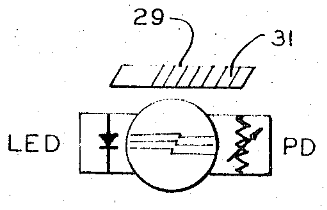
FIG. 4A is a plan-schematic view illustrating the switch of the present invention as a substitute for a potentiometer.
Figure 4B:
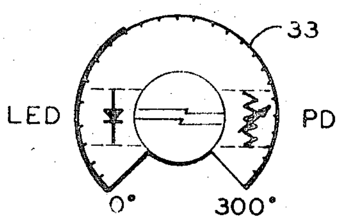
FIG. 4B is a similar view of another form of arrangement which may be substituted for a conventional potentiometer.
Figure 4C:
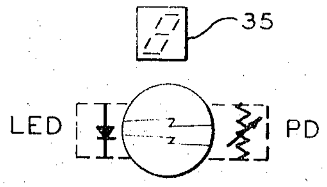
FIG. 4C is a switch arrangement which can be used as a substitute for a thumb wheel digital switch.
Figure 4D:
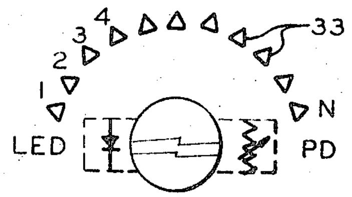
FIG. 4D illustrates in a similar view the implementation of a substitute for a rotary switch.

A preferred form of switch is shown in FIG. 1. A hole 11 is cut in the panel 13 and a light emitting diode 15 placed at one end of a diameter of the circle cut in the panel. Opposite the light emitting diode is a photo-detector 17 arranged to intersect the light emitted by the diode 15. The light emitting diode may instead be an incandescent bulb and the use of a circular hole is used here only as an example. The hole or recess could be square, rectangular, etc. The only requirement is that a light path and field of view across the hole be established. Switch operation is initiated by the operator placing his finger in the opening 11 to break the light beam to, in turn, activate logic to be described below. In applications where it is desirable to have a more conventional type of switch activation, the embodiments of FIGS. 2 and 3 may be used. In FIG. 2 mask 19 is coupled to a toggle switch 21 to move as the switch is toggled. The light emitting diode 15 is placed on one side of the mask and the photo-dectector 17 on the other side. In one position a slit 23 permits light to pass from the diode 15 to detector 17. When the switch is moved to the other position, the slit 23 is moved out of the path, which is then blocked, and the switching action takes place. Similarly, as shown on FIG. 3, the mask can be mounted to a push-button switch 25 so that with the push-button switch in an up position the slit 23 will provide a path from diode 15 to detector 17, but when the switch is pushed down the mask 17 will break the path.

FIG. 4 shows a number of possible arrangements of the switch of FIG. 1 with associated displays to replace various types of conventional switches. FIG. 4-A shows a first arrangement which is a substitute for a conventional potentiometer. Associated with the switch is a barometer type display 29 comprising a plurality of lighted segments 31. The circuits to be described below will cause the segments to be progressively lighted for as long as the operator's finger is held in the switch. Thus, he may hold his finger therein until he reaches the desired percentage or degree of lighting representing a potentiometer position. In FIG. 4-B a plurality of light emitting diodes 33 or similar devices are arranged in a circle or part of a circle around the switch. In a manner similar to that described above, the lights will cumulatively light as the operator holds his finger in the switch until he reaches the desired position. In each case, when the end of the display is reached, all lights will extinguish and the display will recycle back to the beginning in a manner to be described below. FIG. 4-C illustrates a substitute for a thumbwheel switch. The typical thumbwheel switch will have a digit associated with each position of the switch. Thus, a numeric display 35 is provided along with the switch. In a manner similar to the operation in the potentiometer mode, the displayed number will increase from zero to nine for as long as the operator keeps his finger activating the switch. When the required number is reached, the operator may remove his finger and that number will be retained. FIG. 4-D illustrates the implementation of a rotary switch. Operation is similar to that described above in connection with FIG. 4-B except that only one of the display diodes 33 will be on at one time. Thus, as the operator's finger is held in the opening to operate the switch, the diodes 33 will sequentially light indicating the various switch positions. When the desired switch position is reached, the operator may then remove his finger and the system will stay at that position.

Figure 5:
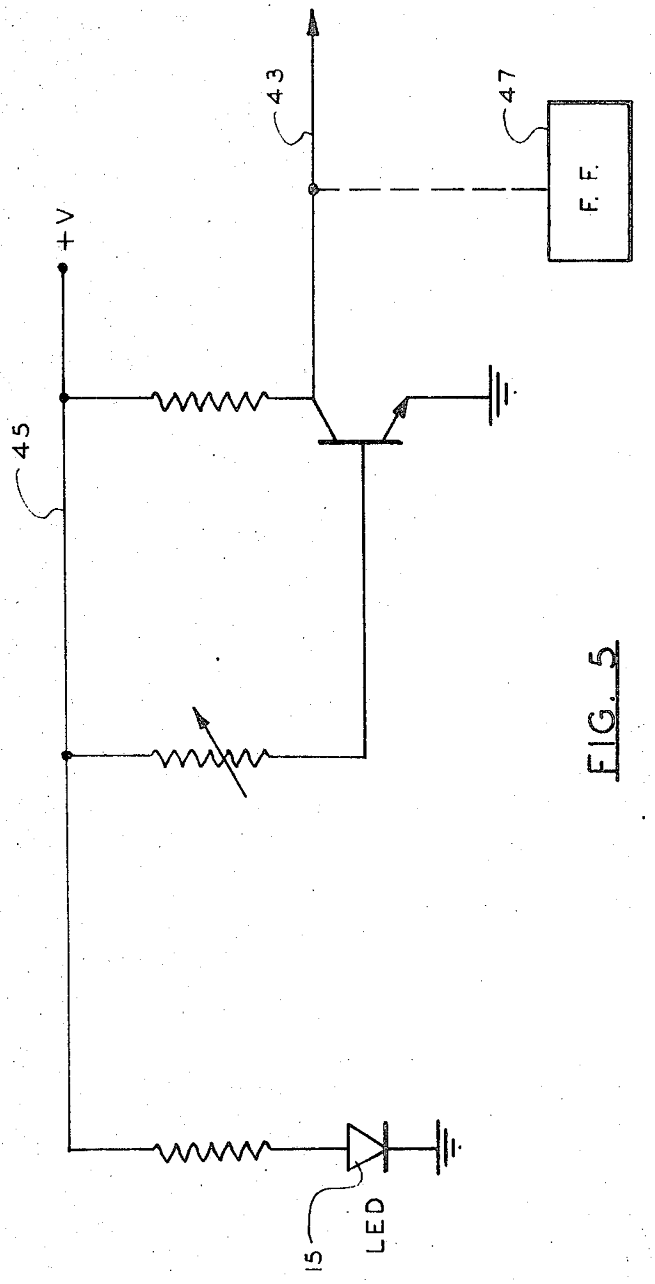
FIG. 5 is a schematic diagram of a typical switch circuit according to the present invention.
Figure 6:
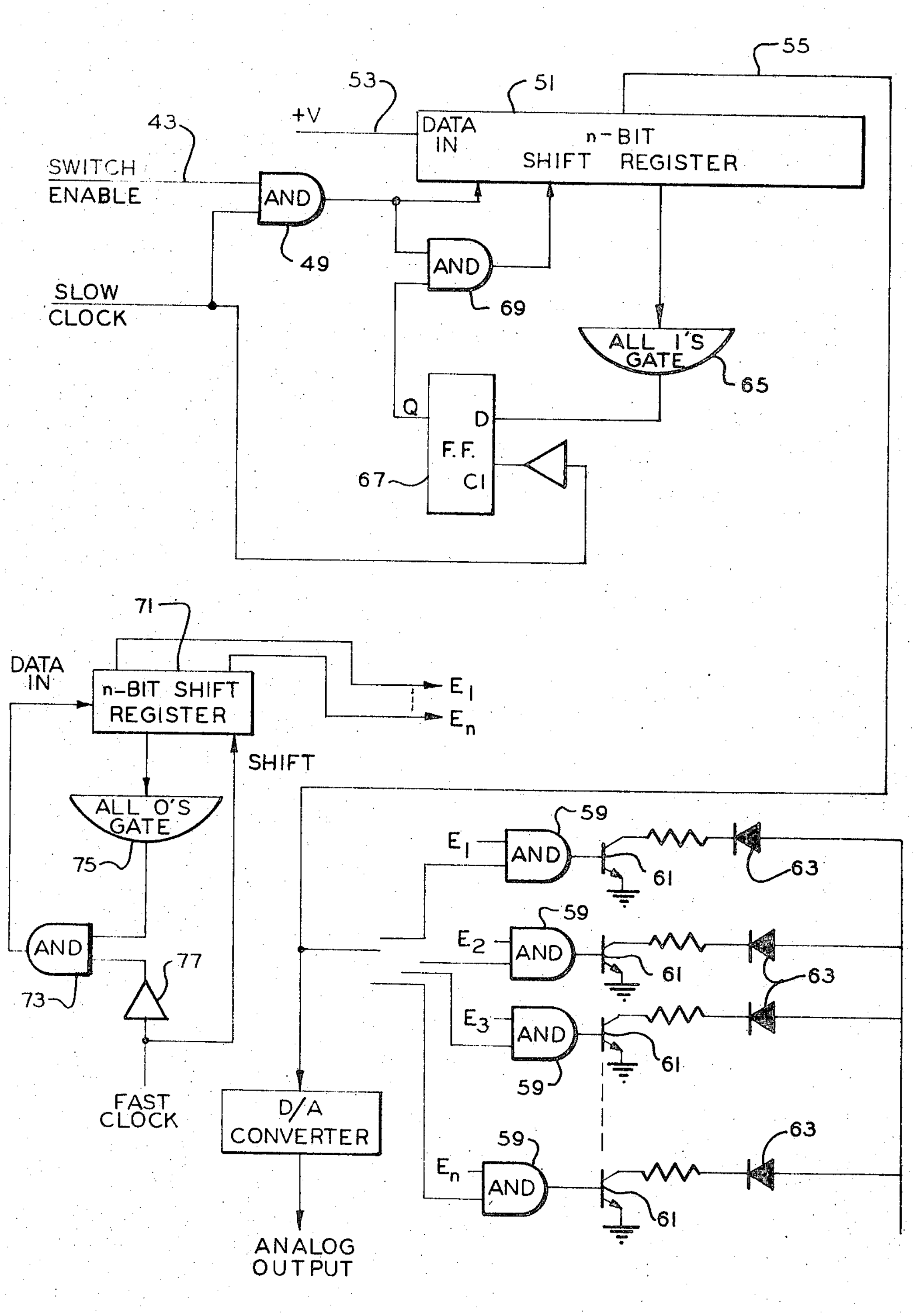
FIG. 6 is a schematic-logic diagram illustrating the manner in which potentiometer action can be obtained from a switch according to the present invention.

FIG. 5 illustrates a typical switch circuit. When the light path from light emitting diode 15 to the photo-detector 17 is clear, photo-detector 17 will have a low resistance and will keep transistor 41 turned on. Thus, the output at the emitter of transistor 41 on line 43 will be near ground. However, when the light path is broken the photo-detector will exhibit a high resistance and transistor 41 will be turned off. The output on line 43 will then go to the positive voltage being provided on line 45. If a momentary switch action is desired, this output may be used directly as the momentary output. If alternate action is required, the output may be provided as a trigger to a flip-flop 45 alternately setting and resetting it each time the switch is activated. If used as potentiometer, the output may be provided to a circuit such as that shown on FIG. 6.

The output of the switch on line 43 will provide an enabling input to an AND gate 49 which will have as its second input a slow clock rate, for example, 2Hz. An N bit shift register 51 will have as its data input a positive voltage on line 53. The output of gate 49 provides the shift input to register 51. As long as the gate is enabled, a series of "ones" will be shifted into the shift register each time a clock pulse appears. The shift register output is provided on N parallel lines indicated collectively by line 55 to a digital to analog converter 57 where it may be converted to an analog output corresponding to the output normally obtained from a potentiometer. These outputs are also provided to a plurality of AND gates 59, each of which will control a driver 61 driving an LED 63 in a display such as that shown on FIG. 4A or B. The output of the shift register is also provided in parallel to an AND gate 65 termed on "All Ones" gate. Gate 65 provides an input to a flip-flop 67 having a clock input from the slow clock.

On the next clock input after "All Ones" appears at gate 65, flip-flop 67 will be set and will enable a gate 69 to reset the shift register on the next output from gate 49. This will reset the shift register to all zeros and it will then begin loading up again with a corresponding indication on the indicator described in connection with FIGS. 4-A and B.

To avoid the large power drain which would occur if all LEDs were on at one time, means are provided to multiplex the LED outputs. A second N bit shift register 71 obtains its data input from a gate 73. Gate 73 has as an enabling input the output of an "all zeros" AND gate 75. The shift input to register 71 is provided from a fast clock. The fast clock pulses, after inversion through an inverter 77, provide the second input to AND gate 73. Thus, when all zeros are in the shift register 71, a "one" will be loaded into the first bit of shift register 71. At that point the output of gate 75 will no longer be present. Thus, this one bit will be shifted through each position of the shift register until it is completely shifted out. At that point the "all zeros" gate 75 will again have an output and a "one" will start in the first bit position again. In this way the N parallel outputs of shift register 71 will continuously sequence. These outputs designated $E_1, E_2 \ldots E_N$ are provided as the second input to the gates 59, thereby causing only one LED to be illuminated at one time. Because of the fast cycling rate of the fast clock input, the LEDs will be cycled at a fast enough rate so that it will not be apparent that they are not on all the time.

Figure 7:
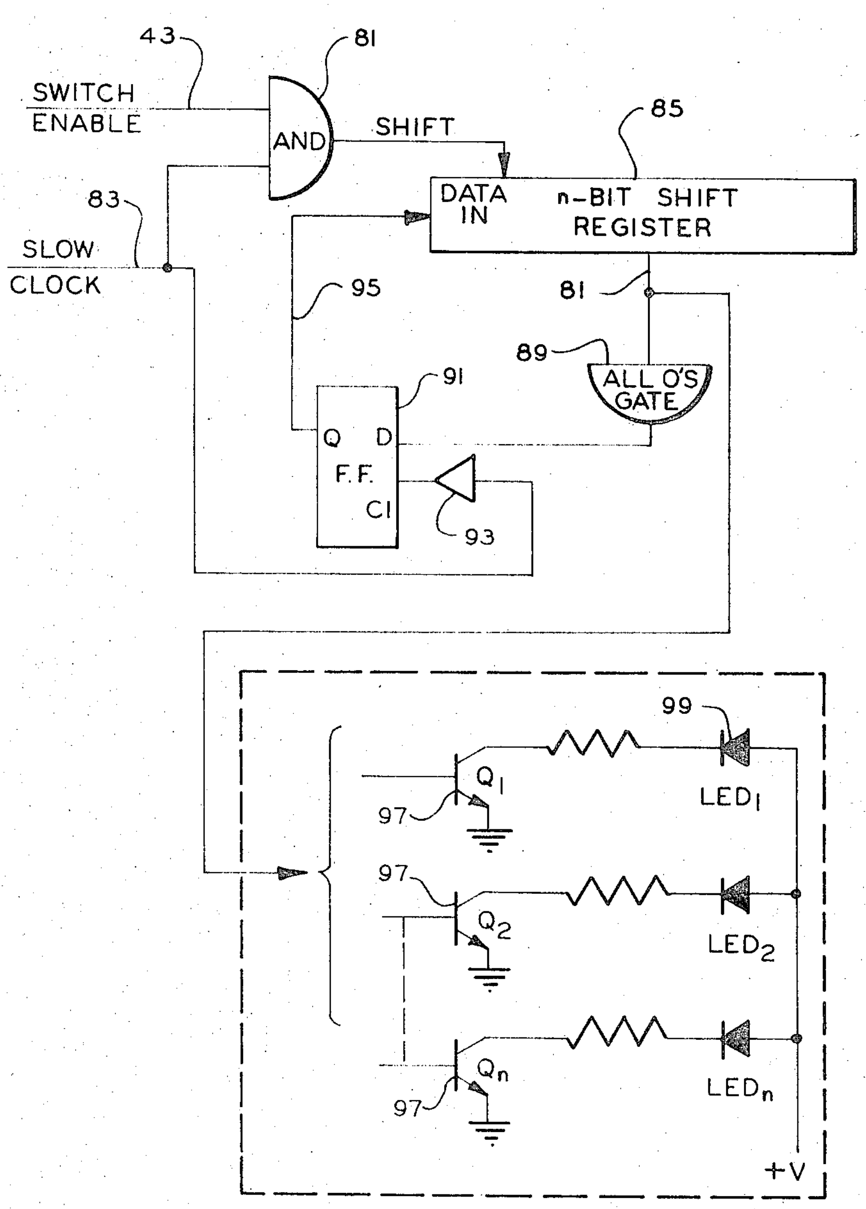
FIG. 7 is a schematic-logic diagram of the implementation of a solid state rotary switch according to the present invention.

The implementation of a solid state rotary switch is illustrated on FIG. 7. As before, the input on line 43 is provided to an AND gate 81 where it is ANDED with a slow clock input on line 83. The output is provided as the shift input to a shift register 85. The parallel outputs of shift register 85 on line 87 are provided to an "All Zeros" AND gate 89 which will have an output when all zeros are present at its input. This output is provided as a data input to a flip-flop 91 which is triggered by the slow clock pulses on line 83 after inversion through an inverter 93. When the shift register 85 is at all zeros, an output will be present at gate 89 which will be loaded in the flip-flop 91 to set the flip-flop. The set output of the flip-flop on line 95 is provided as the data input to the shift register 85, and on the next clock pulse will be shifted into the register. AND gate 89 will now no longer have all zeros at its input and its output will go to zero. On the next clock pulse this will cause flip-flop 91 to be reset. Thus, there is a data input to the shift register for only one clock pulse. This one bit will be shifted through each bit position in the shift register until it is finally shifted out, at which time gate 89 will again have all zeros as inputs and the process will be repeated. Thus, as long as the switch enable signal resulting from the breaking of the light path in the switch is present on line 43, a single bit will sequentially be shifted through the shift register 85. The parallel outputs of shift register 85 on line 87 are also provided to N transistor driving circuits 97. Associated with each of the transistors is a LED 99 which will be lighted thereby. These are the same as LEDs 35 of FIG. 4-D. Thus, as long as the switch is activated, the output will sequence through each of the light positions shown until it reaches the end at which point it will return to the first position. In this manner action equivalent to that of a rotary switch is obtained.

Figure 8:
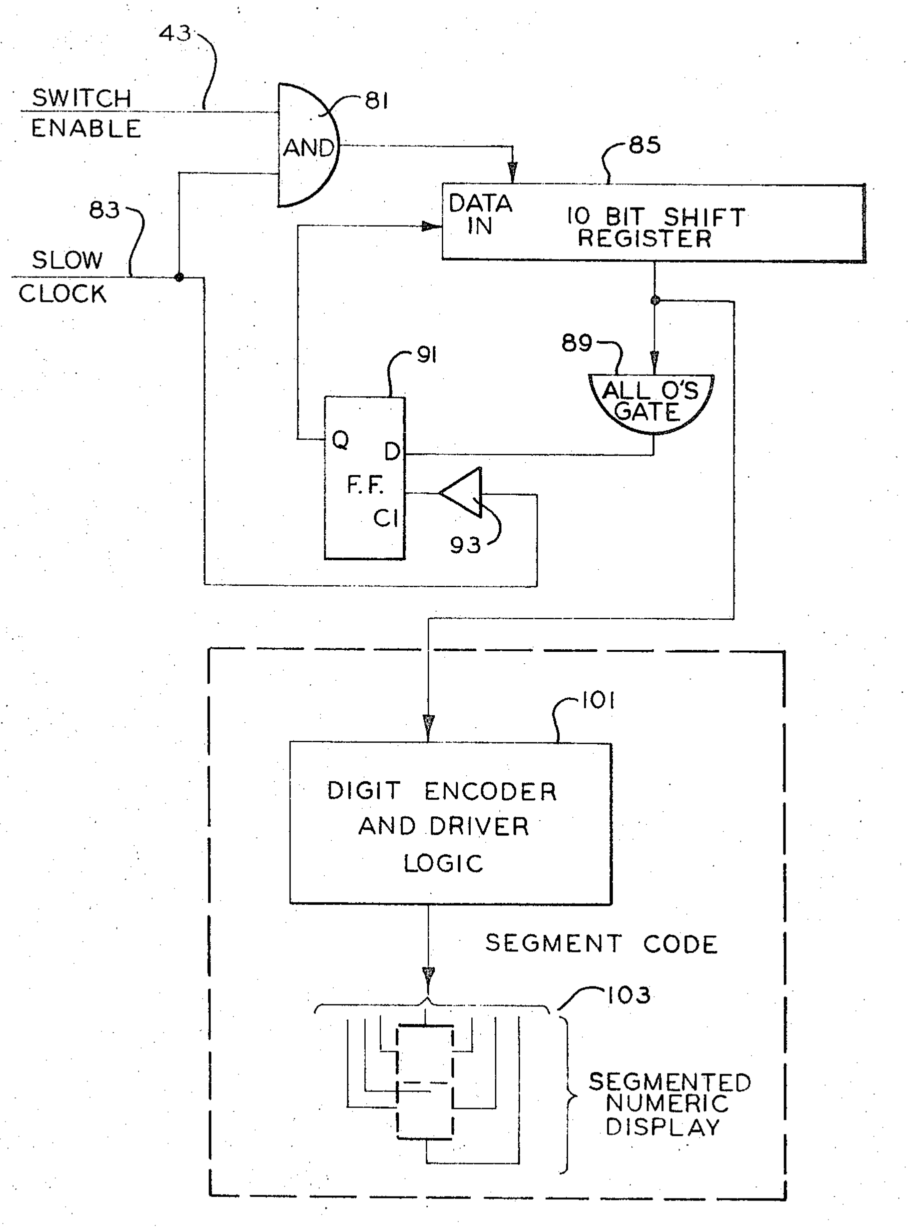
FIG. 8 is a similar diagram of the implementation of a thumb wheel switch to the present invention.

FIG. 8 illustrates implementation of a thumbwheel switch. The operation here is almost identical to that of the rotary switch described above and common elements are given common reference numerals. Shift register 85 will be a ten bit shift register since the output goes from zero to nine. Thus, on the parallel outputs 87 from shift register 85 there will be ten outputs each appearing in sequence. These ten outputs are provided as inputs to digital encoder and logic driver 101, where they will be decoded into the proper outputs to drive a numeric display 103 such as a segmented display shown on the Figure. Such decoders are well known in the art and are available from the manufacturers of numeric displays.

Figure 9:
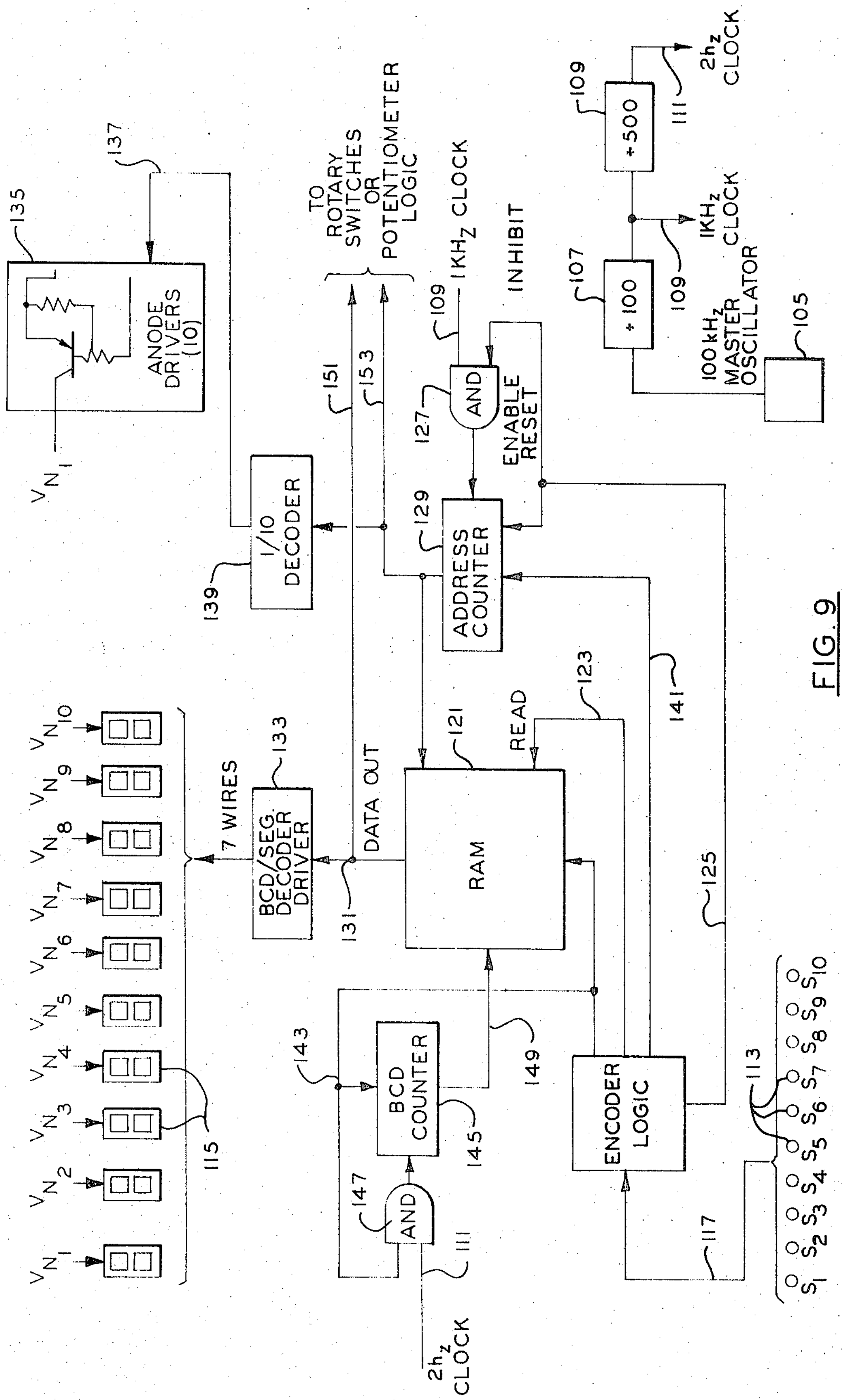
FIG. 9 is a logic-block diagram of a time sharing system using switches according to the present invention.

A single control panel can have any number of displays such as display 103 on FIG. 8. However, it should be recognized that an operator may only change one of these at a time. Thus, it becomes possible to time share portions of the circuitry and to, thereby, decrease the amount of hardware required to implement a control panel using the techniques described above. An example of such a time shared system is shown on FIG. 9. In the lower portion of the figure there is shown a master oscillator 105 which operates at 100 kilohertz for example. Also shown is a divider 107 which may comprise a plurality of flip-flops in series to perform a division by 100 to obtain a 1 kilohertz clock output on line 109. The 1 kilohertz output is similarly divided down by a factor of 500 in a counter or divider 109 to provide a 2 hertz clock output on line 111. This can be the slow clock referred to above whereas the 100 kilohertz or 1 kilohertz clock could supply the fast clock used in time sharing the displays of FIG. 6. A plurality of ten switches 113 such as those described in connection with FIGS. 1 and 2 are provided, one being provided for each of the ten numeric displays 115. The outputs of these switches corresponding to switch enable line 43 described above are provided on ten parallel lines 117 to encoder logic 119. A random access memory 121 is provided to store the data to be displayed on each of the 10 numeric displays 115. This data will be stored in a manner to be described below. Normally, when none of the switches 113 are being activated encoder logic 119 will provide a read enable on line 123 to the memory 121. Also during this condition the "or" output on line 125 to gate 127 will be in a condition where it will not inhibit that gate which has as its other input the 1 kilohertz clock on line 109. Thus, the 1 kilohertz clock will be provided as an input to an address counter 129. The output of the address counter 129 will be provided as an address input to read only memory 121 and will sequentially address each of the ten data words stored therein. Each data word will comprise four bits in BCD and will be provided as an output on a common four line output buss 131 to a BCD to segment decoder driver 133. The BCD to segment decoder driver provides seven outputs corresponding to the segments on the numeric displays 115. Such decoders are well known in the art and available in prepackaged units. The seven output lines of decoder 133 are provided in parallel to each of the ten numeric displays 115. The segment return path is provided through a plurality of anode drivers 135 of which one is shown as an example. These comprise basically a transistor switch responsive to an input from a line 137, ten of which will be provided, one for each driver. The output of decimal address counter 129 is also provided to a one out of ten decoder 139 which will decode the BCD output of counter 129 into a one out of 10 code, causing only one of the 10 lines 137 to be activated at one time. Activation of a corresponding line will turn on the anode driver 135 and enable its corresponding numeric display 115. Thus, only the display 115 which is having its corresponding digital word addressed in the memory 121 will be turned on at any given time. Because of the high frequency of the clock input to gate 109, each of the displays 115 will appear to remain on constantly.

When it is desired to change the number in one of the displays 115 one of the switches 113 will be operated. Encoder logic 119 will encode the input from this one switch into the BCD address for the corresponding display 115, and provide this code on four wires 141 to the address counter 129. In response to any input on a line 117 encoder logic 119 will also provide an output on line 125 which will inhibit the gate 127 to prevent the counter from advancing and also to provide a preset input to the counter to cause the number on line 141 to be loaded therein. In this manner the counter will be addressing the memory location corresponding to the display associated with the switch being operated. When this occurs, as long as the switch is being operated, the remaining displays 115 will be blank. An input on any of the lines 117 to encoder logic 119 will further cause the read enable on line 123 to be removed and will change the level on line 143 to enable the write input to the memory 121. The change in level on line 143 will provide a reset trigger to a BCD counter 145 resetting it to zero. The output on line 143 will also enable an AND gate 147 which has as its other input the 2 kilohertz clock from line 111. Counter 145 performs a function similar to that of the ten bit shift register of FIG. 8 except that it provides a BCD count which will advance from zero to nine and then recycle. As long as the switch is held activated the counter will increment by one digit for each clock pulse on line 111. The output of counter 145 is provided on four lines 149 as the data input to the memory 121, and, since the write input is present on line 143 this data will be loaded into the memory. It will be loaded into the location corresponding to the switch being activated, since that is the location being addressed as explained above. This data will also at the same time be output on line 131, decoded by decoder 133, and provided to the corresponding display 115. Thus, the operator may operate his switch, watching the display until it reaches the desired digit, at which point he may remove his finger from the switch and normal operation will resume with the system cycling through all of the displays.

Also shown are lines 151 from the memory 121 and 153 from the address counter being provided to rotary switch and potentiometer indicators. This demonstrates that memory 121 may also provide rotary switch and potentiometer outputs to the indicators described above in a manner similar to the way data is provided to the numeric displays. In this way a great deal of the circuitry is shared by all switches. In addition, since only one of the displays is being illuminated at one time a significant reduction in power results.

Thus, a switch which has no mechanical components and a number of ways of implementing the switch to take the place of various types of conventional types of switching mechanisms has been shown. Although specific embodiments have been described and illustrated, it will be evident to those skilled in the art that various modifications may be made without departing from the spirit of the invention which is intended to be limited solely by the appended claims.

What is claimed is:

1. Control panel switching apparatus comprising:

a. a control panel base constructed of a thin sheet of rigid material having at least one hole therein of a size large enough to insert a human finger therethrough;

b. a light source at an edge of said hole and aimed to project across said hole;

c. light detecting means across from said light source and positioned to intersect the light therefrom, said detecting means providing an output at a first level when light is imaged thereon and at a second level when no light is imaged thereon;

d. a transistor switch obtaining its input from the output of said detecting means and providing its output as the output of the switching apparatus said transistor adapted to provide a ground output in response to said first level and a high output in response to said second level whereby inserting a finger in said hole momentary switching action may be obtained;

e. a plurality of n indicators mounted in said panel adjacent said hole and arranged in contiguous relationship;

f. an n bit shift register having its n outputs coupled to said n indicators;

g. means to load and shift, at a slow rate, a plurality of ones into said shift register in response to a high output from said transistor; and h. means to reset said shift register upon all bits in said register becoming ones whereby action equivalent to that of a potentiometer may be obtained by inserting a finger in said hole until the desired percentage of indicators are lighted.

2. The invention according to claim 1 and further including a digital to analog converter coupled to the n outputs of said shift register providing an analog output corresponding to a conventional potentiometer output.

3. The invention according to claim 1 wherein the data input of said shift register is coupled to a voltage source and said means to load and shift comprise:

a. a slow clock; and b. a first AND gate having as inputs the output of said slow clock and the output of said transistor and providing its output as a shift input to said shift register.

4. The invention according to claim 3 wherein said means to reset comprise:

a. a second AND gate having as inputs the *n* output of said register and providing an output when all inputs are present;

b. a flip-flop obtaining its data input from said second AND gate;

c. an inverter having said slow clock output as an input and providing its output as a clock input to said flip-flop; and d. a third AND gate having as inputs the output of said flip-flop and of said first gate and providing its output to reset said shift register.

5. The invention according to claim 4 wherein said *n* outputs are coupled to said *n* indicators through *n* lamp drivers and further including:

a. n AND gates each having as one input an output from said shift register and providing its output to one of said n drivers: and b. means to sequentially enable, at a rate faster than the response of the eye, each of said *n* gates.

6. The invention according to claim 5 wherein said mean to enable comprise;

a. a fast clock;

b. a second n bit shift register obtaining its shift input from said fast clock and providing its n outputs as enabling inputs to said *n* gates;

c. a fourth AND gate having as inputs the *n* inverted outputs of said second shift register;

d. a second inverter obtaining its input from said fast clock; and e. a fifth AND gate having as inputs the output of said fourth AND gate and of said inverter and providing its output as a data input to said second shift register.

7. An n position rotary switch comprising:

a. a control panel base constructed of a thin sheet of rigid material having at least one hole therein of a size large enough to insert a human finger therethrough;

b. a light source at an edge of said hole and aimed to project across said hole;

c. light detecting means across from said light source and positioned to intersect the light therefrom, said detecting means providing an output at a first level when light is imaged thereon and at a second level when no light is imaged thereon;

d. a transistor switch obtaining its input from the output of said detecting means and providing its output as the output of the switching apparatus said transistor adapted to provide a ground output in response to said first level and a high output in response to said second level whereby inserting e. a plurality of n indicators mounted in said panel adjacent said hole and arranged in contiguous relationship;

f. an n bit shift register having its n outputs coupled to said n indicators; and g. means responsive to the high output of said transistor to sequentially shift a single bit through said shift register for as long as said output is present.

8. The invention according to claim 7 wherein said indicators are coupled through lamp drivers.

9. The invention according to claim 7 wherein said responsive means comprise:

a. a first AND gate having its inputs connected to the *n* outputs of said shift register and responsive to said inputs to provide a high output when all inputs are zero;

b. a flip-flop obtaining its data input from said first AND gate and providing its output as a data input to said shift register;

c. a slow clock;

d. an inverter having the output of said slow clock as an input and providing its output as a clock input to said flip-flop; and e. a second AND gate having as inputs said slow clock and the output of said transistor and providing its output as a shift input to said shift register.

10. Switching apparatus duplicating the action of a thumbwheel switch comprising:

a. a control panel base constructed of a thin sheet of rigid material having at least one hole therein of a size large enough to insert a human finger therethrough;

b. a light source at an edge of said hole and aimed to project across said hole;

c. light detecting means across from said light source and positioned to intersect the light therefrom, said detecting means providing an output at a first level when light is imaged thereon and at a second level when no light is imaged thereon;

d. a transistor switch obtaining its input from the output of said detecting means and providing its output as the output of the switching apparatus said transistor adapted to provide a ground output in response to said first level and a high output in response to said second level whereby inserting a finger in said hole momentary switching action may be obtained;

e. a segmented numeric display mounted in said panel adjacent said hole; and f. means responsive to the output of said transistor to sequence the number displayed on said display from zero through nine for as long as said output is high.

11. the invention according to claim 10 wherein said means to sequence comprise:

a. a ten bit shift register;

b. a digit encoder and driver having the ten outputs of said shift register as inputs and providing its outputs to drive said numeric display;

c. a first AND gate having its inputs connected to the n outputs of said shift register and responsive to said inputs to provide a high output when all inputs are zero;

d. a flip-flop obtaining its data input from said first AND gate and providing its output as a data input to said shift register;

e. a slow clock;

f. an inverter having the output of said slow clock as an input and providing its output as a clock input to said flip-flop; and g. a second AND gate having as inputs said slow clock and the output of said transistor and providing its output as a shift input to said shift register.

12. The invention according to claim 10 wherein a plurality of holes each having associated light sources, detecting menas, transistors and numeric displays are provided and said responsive means comprises:

a. a memory to store the current number to be displayed on each of said displays;

b. means to sequentially read said numbers in said memory and to provide said numbers to activate the respective ones of said displays;

c. means responsive to a high output from any transistor to disable said means to read and to address the memory to the display associated with the transistor having a high output and to enable writing in that memory location; and d. means responsive to said high output to cause the number sequencing from zero to nine to be written into said memory location.

13. The invention according to claim 12 wherein said means to sequence, means to disable and means to write comprise:

a. encoder logic having as inputs the outputs of the plurality of transistors and providing in response to one of said inputs a first output identifying the input line, a second output providing a write enable to said memory, a third read disable output and a fourth inhibit output;

b. a fast clock;

c. a first AND gate having the output of said fast clock and said fourth inhibit output as inputs and adapted to pass pulses from said clock in the absence of said inhibit input;

d. an address counter obtaining its clock input from said first gate; having said first output as a preset input, and said fourth output as a preset enable input and providing its output to address said memory;

e. a segment decoder having its inputs coupled to the data output of said memory and providing its outputs in parallel to all of said plurality of displays;

f. a plurality of anode drivers one being coupled to each of said plurality of displays and enabling their associated display only when activated;

g. a one of n decoder having the output of said address counter as input, and providing activating outputs to said anode drivers;

h. a slow clock;

i. a second AND gate having said slow clock and said second logic output as inputs; and j. a second counter having said second logic output as a reset input, said second AND gate output as a count input and providing its output as a data input to said memory whereby in the absence of any transistor high output said fast clock will sequence said address counter through each of said plurality of indicators with said one of n decoder simultaneously enabling the associated anode driver of the addressed indicator and in response to an output from a transistor said address counter will be preset to the display associated therewith and said counter will sequentially write the numeral from zero to nine in the addressed location for as long as the transistor is high in response to insertion of a finger in its associated hole thereby allowing the operator to change the setting in a manner analogous to setting a thumbwheel switch.

14. The invention according to claim 13 wherein said first output is in BCD, said address counter and second counter are BCD counters and said segment decoder is a BCD to segment decoder.

* * * * *